(12) United States Patent
Magnusson

(10) Patent No.: US 7,619,717 B2
(45) Date of Patent: Nov. 17, 2009

(54) METHOD FOR PERFORMING A FOCUS TEST AND A DEVICE MANUFACTURING METHOD

(75) Inventor: Krister Magnusson, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 551 days.

(21) Appl. No.: 11/546,577

(22) Filed: Oct. 12, 2006

(65) Prior Publication Data

US 2008/0088812 A1     Apr. 17, 2008

(51) Int. Cl.
G03B 27/52 (2006.01)
G03B 27/42 (2006.01)
G03B 27/32 (2006.01)
G03C 5/00 (2006.01)

(52) U.S. Cl. .............................. 355/55; 355/53; 355/77; 430/30

(58) Field of Classification Search .................. 355/52, 355/53, 55, 77; 356/123, 125, 400, 401; 430/5, 30; 250/248
See application file for complete search history.

(56) References Cited

U.S. PATENT DOCUMENTS

| | | | |
|---|---|---|---|
| 2006/0103823 A1* | 5/2006 | Yabe | 355/55 |
| 2006/0103825 A1* | 5/2006 | Kondo | 355/55 |
| 2006/0132744 A1* | 6/2006 | Hauschild et al. | 355/55 |
| 2007/0222965 A1* | 9/2007 | Koenen | 355/72 |

* cited by examiner

*Primary Examiner*—Alan A Mathews
(74) *Attorney, Agent, or Firm*—Pillsbury Winthrop Shaw Pittman LLP

(57) ABSTRACT

The invention relates to a method for a focus test. The method includes performing a first projection by using a radiation beam to project a first reference mark onto a substrate to generate a first reference mark image, and performing a second projection by using a radiation beam to project a first sample mark onto the substrate to generate a first sample mark image, wherein the first reference mark image and the first sample mark image at least partially overlap and the second projection is relatively focus sensitive compared to the first projection.

22 Claims, 6 Drawing Sheets

Prior Art

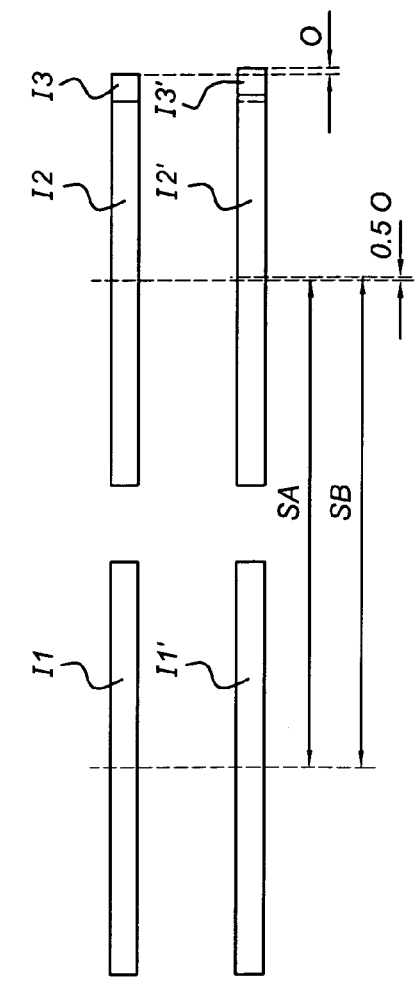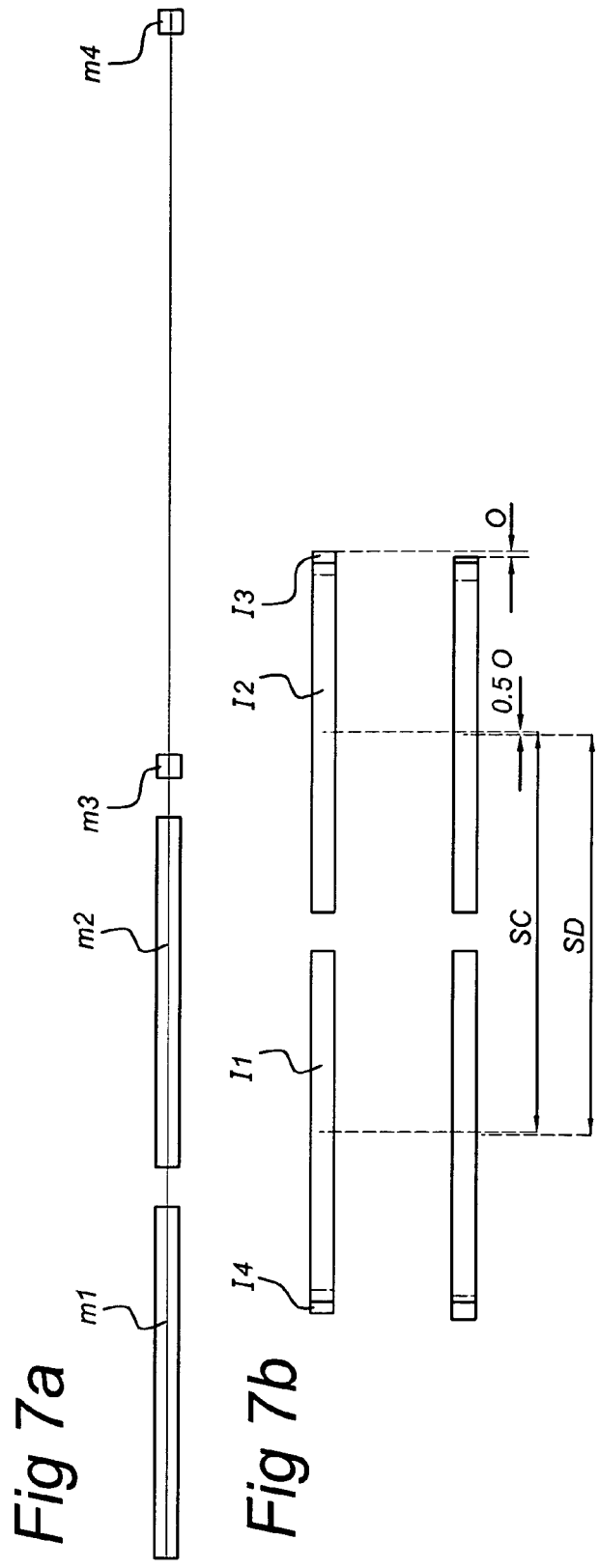
Fig 6
Fig 7a
Fig 7b

METHOD FOR PERFORMING A FOCUS TEST AND A DEVICE MANUFACTURING METHOD

FIELD

The present invention relates to a method for performing a focus test. The invention further relates to a device manufacturing method, a lithographic apparatus, a computer program product, and a data carrier comprising such a computer program product.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to image the pattern via the projection system to the substrate, the layer of resist provided on the substrate should be in the focal plane of the projection system. Focus tests have been developed to test if a substrate is positioned correctly with respect to the focal plane, in which a test pattern provided by a test patterning device is imaged on the layer of resist. Next, a latent image of the test pattern is made visible by performing post exposure processing, for instance, a post exposure bake. After this, the width of, for instance, a line of the created pattern could be measured using, for example, a scanning electron microscope (SEM). By comparing this width with a previously obtained calibration graph (Bossung curve), the defocus can be determined. It will be understood that the width of a line is smallest in the best focus position and will become larger with increasing defocus.

SUMMARY

According to an aspect, there is provided a method for a focus test, comprising:
performing a first projection by using a radiation beam to project a first reference mark onto a substrate to generate a first reference mark image; and
performing a second projection by using a radiation beam to project a first sample mark onto the substrate to generate a first sample mark image,
wherein the first reference mark image and the first sample mark image at least partially overlap and the second projection is relatively focus sensitive compared to the first projection.

According to an aspect, there is provided a device manufacturing method, comprising determining a defocus according to any of the methods described herein, adjusting a relative position of a substrate based on the determined defocus, and projecting the patterned beam of radiation onto a substrate.

According to an aspect, there is provided a lithographic apparatus, comprising:
an illumination system configured to condition a radiation beam;
a support constructed to support a patterning device, the patterning device being capable of imparting the radiation beam with a pattern in its cross-section to form a patterned radiation beam;
a substrate table constructed to hold a substrate;
a projection system configured to project the patterned radiation beam onto a target portion of the substrate; and
a computer arrangement to perform any of the methods described herein.

According to an aspect, there is provided a computer program product comprising instructions and data to allow a processor to run a program in accordance with any of the methods described herein.

According to an aspect, there is provided a data carrier comprising the above-described computer program product.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 6 schematically images of projected marks according to an embodiment;

FIGS. 7a, 7b, 8a and 8b schematically depict marks and images according to an embodiment.

DETAILED DESCRIPTION

Figure 1:
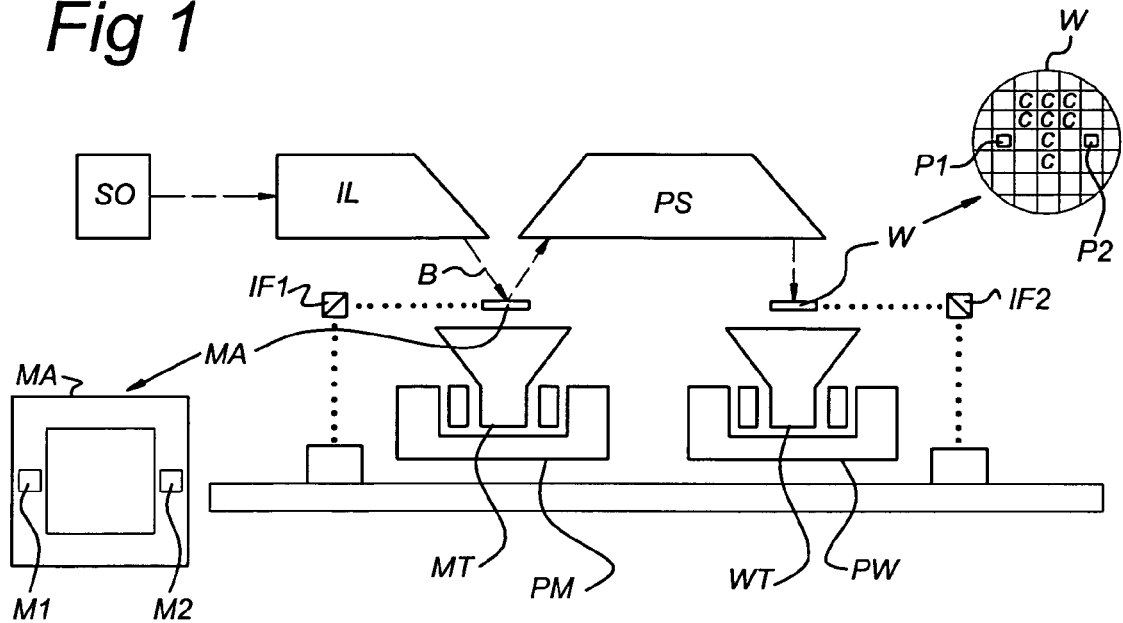
FIG. 1 depicts a lithographic apparatus according to an embodiment.

FIG. 1 schematically depicts a lithographic apparatus according to one embodiment of the invention. The apparatus comprises:
an illumination system (illuminator) IL configured to condition a radiation beam B (e.g. UV radiation or EUV radiation);
a support structure (e.g. a mask table) MT constructed to support a patterning device (e.g. a mask) MA and connected to a first positioner PM configured to accurately position the patterning device in accordance with certain parameters;
a substrate table (e.g. a wafer table) WT constructed to hold a substrate (e.g. a resist-coated wafer) W and connected to a second positioner PW configured to accurately position the substrate in accordance with certain parameters; and
a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system comprising, for example, suitable directing mirrors and/or a beam expander. In other cases the source may be an integral part of the lithographic apparatus, for example when the source is a mercury lamp. The source SO and the illuminator IL, together with the beam delivery system if required, may be referred to as a radiation system.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

A tool used for a focus test as described above are Bossung curves. A Bossung curve describes the relation between (de) focus D and critical dimension CD. The term critical dimension is known in the field and is equal to the size or width of a feature printed in resist, measured at a specific height above the substrate. This may also be called the line width or feature width.

Figure 3:
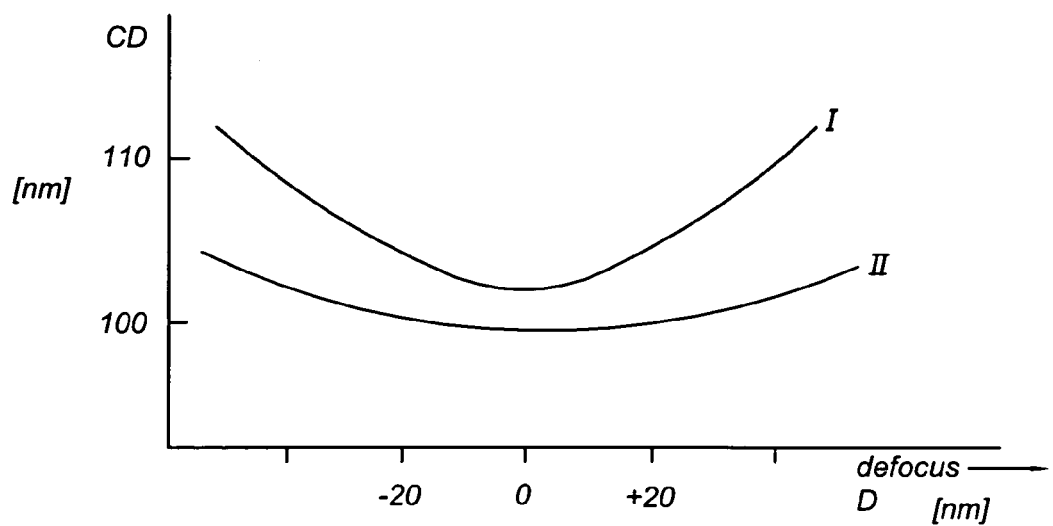
FIG. 3 schematically depicts Bossung curves.

FIG. 3 schematically depicts a graph comprising two different Bossung curves. The horizontal axis represents the defocus D, where 0 represents the situation in which the substrate W is positioned in focus. The vertical axis represents the critical dimension CD. Both curves show that the critical dimension CD is optimal (smallest) when the substrate W is in focus (defocus D=0). The Bossung curve shows a quadratic behavior as a function of defocus D.

The shape of the Bossung curve is different for different situations, and varies with, for instance, the width of a line that is imaged and the exposure dose used. FIG. 3 shows a first Bossung curve I, being relatively sensitive to variations of the relative position of the substrate W with respect to the focal plane. This may, for instance, be a Bossung curve I for exposure of a relatively thin line and/or an exposure using a relatively high exposure dose. FIG. 3 further shows a second Bossung curve II, being relatively insensitive to variations of the relative position of the substrate W with respect to the focal plane. This may, for instance, be a Bossung curve II for exposure of a relatively thick line and/or an exposure using a relatively low exposure dose.

Based on the above, it will be understood that the line width of an imaged line will increase when imaged out of focus. The increase in line width, among others things, depends on the width of the exposed line and the exposure dose used.

These variations between different Bossung curves will be used in one or more embodiments below to develop a focus test.

Figures 2A, 2B:
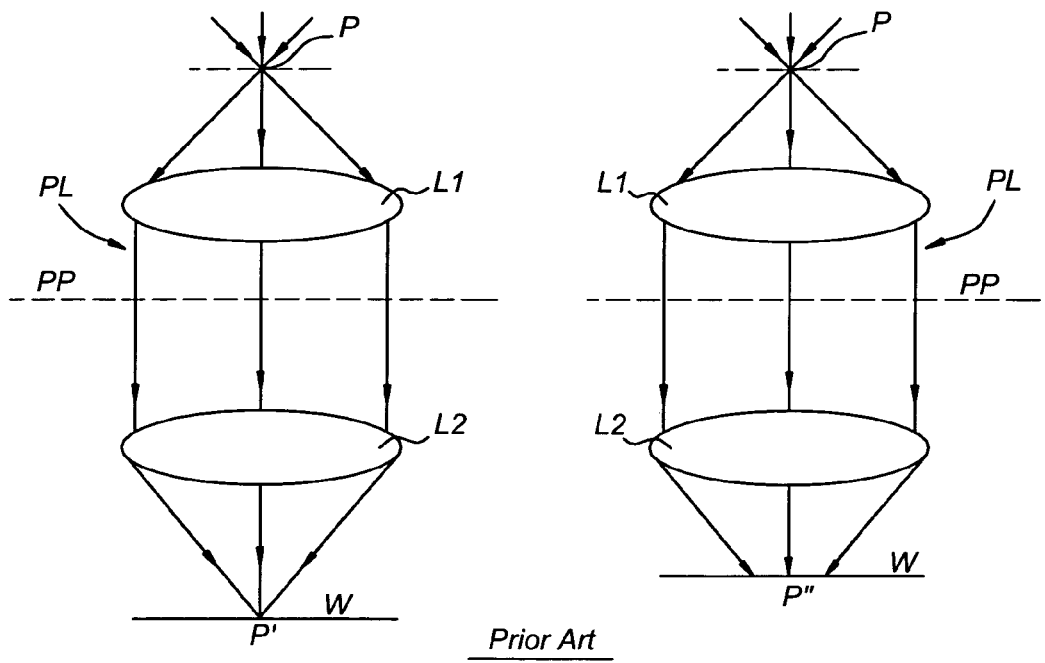
FIGS. 2a and 2b depict a telecentric focus test according to the state of the art.

FIGS. 2a and 2b schematically depict a simple and straight-forward prior art focus test. FIG. 2a shows a telecentric projection system PL comprising a first lens L1 and a second lens L2. Between the first lens L1 and the second lens L2 is a pupil plane PP. It will be understood that for reasons of simplicity only two lenses are depicted in FIG. 2, but that the projection system PS may in general comprise any number of lenses. A test pattern provided by, for example, a test device P is imaged via projection system PL on the surface of substrate W. The test device P may be provided on a patterning device MA. For example, it may be a test device P that is specially added to the patterning device MA for test purposes, but it may also be formed as part of the pattern provided by the patterning device MA to produce, for example, ICs. The patterning device MA may be, for example, a patterning device MA that is specially used for performing a focus test.

In the situation depicted in FIG. 2a, the substrate W is substantially in the focal plane of the projection system PL and test device P is imaged as a sharp test structure P'. FIG. 2b shows the same components, but now substrate W is positioned above the focal plane of the projection system PL. Test structure P is now projected as a blurred test structure P'''. The amount of blurring depends on the amount of defocus. However, the amount of blurring does not depend on the direction of the defocus; if substrate W would have been positioned a similar distance below the focal plane of the projection system PL, the same amount of blurring would have been generated. Based on the test structure P'', it is impossible to determine the substrate W is above or below the focal plane of the projection system PL.

The amount of blurring may be measured by measuring the width of, for instance, a line of the created pattern, after developing, using, for example, a scanning electron microscope (SEM). Since the behavior of the width varying with defocus is known from a previously obtained Bossung curve, the amount of defocus D may be determined based on the measured width.

Figure 4A:
FIGS. 4a and 4b schematically depict marks and images according to an embodiment.
Figure 4B:
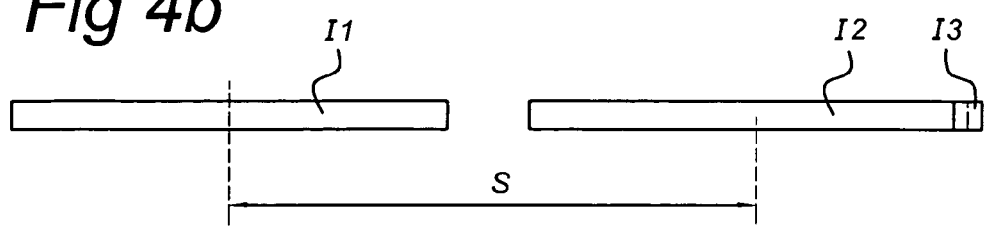

According to an embodiment of the invention, a focus test is provided as schematically depicted in FIGS. 4a and 4b. According to this embodiment, three marks M1, M2, M3 are projected on a substrate W by the projection system PS. FIG. 4b schematically depicts projected images I1, I2, I3 of the three marks M1, M2, M3.

The marks M1, M2, M3 may be provided by a patterning device MA. The marks M1, M2, M3 may simply be lines having a predetermined width. FIG. 4a shows a cross-sectional view of these lines, showing their width. It will be understood that the lines extend in a direction perpendicular to the drawing surface.

The second reference mark M1 and the first reference mark M2 are chosen to be relatively focus insensitive, i.e. the line widths of corresponding imaged reference marks I1, I2 do not change much as a function of defocus D. The Bossung curve of the projection of the second reference mark M1 and the first reference mark M2 may, for instance, be similar to the second Bossung curve II shown in FIG. 3.

The first sample mark M3 may be chosen to be relatively focus sensitive, i.e. the line width of the corresponding imaged first sample mark I3 changes relatively much as a function of defocus D. The Bossung curve of the projection of the first sample mark M3 may, for instance, be similar to the first Bossung curve I shown in FIG. 3.

In order to achieve this difference in focus sensitivity between the first and second reference marks M1, M2 and the first sample mark M3, the first and second reference marks M1, M2 may be chosen to be approximately 15 times larger than the first sample mark M3. The projected first and second reference mark images I1, I2 may, for instance, be bars having a width of 7700 nm, while the projected first sample mark image I3 may be a bar having a width of 500 nm.

It will be understood that the focus sensitivity of the projection of the marks M1, M2, M3 may not only be influenced by varying the width of the marks, but may also be adjusted by varying the exposure dose used to project the marks. The first and second reference marks M1, M2 may, for instance, be exposed with a dose level providing maximum CD focus insensitivity (a so called isofocal dose level), while the first sample mark M3 may be exposed with a relatively high exposure dose, for instance 3.5 times the exposure dose used for projecting the first and second reference marks M1, M2.

In a first projection action, the first and second reference marks M1, M2 are projected. The distance between the midpoints of the projected reference mark images I1, I2 is known, as it can be determined based on the known distance of the first and second reference marks M1, M2 on the patterning device MA and the magnification factor of the projection system PS used.

In a second projection action, the first sample mark M3 is projected in such a way that the first sample mark image I3 partially overlaps the first reference mark image I2. The first sample mark M3 may, for instance, be projected such that 50% of the first sample mark image I3 overlaps the first reference mark image I2 (in focus). Of course, different overlap percentages may be used.

The first and second reference marks M1, M2 and the first sample mark M3 may be provided by one and the same patterning device MA. According to an alternative, the first and second reference marks M1, M2 may be provided by a first patterning device MA and the first sample mark M3 may be provided by a second patterning device MA. According to this alternative, in between the first and second projection, the first patterning device MA is replaced with the second patterning device MA. First and second reference marks M1, M2 and first sample mark M3 may also each be provided by a different patterning device.

According to an embodiment, the second reference mark M1 may be omitted, and instead of the second reference mark image I1, a mark may be used which was already present on the substrate W, for instance a mark provided in a previous imaging and developing cycle, or a mark provided on the substrate W during the manufacturing of the substrate W.

In a next action, the still latent images are made visible by performing post-exposure processing, for instance, a post exposure bake. After this, the distance S between the second reference mark image I1 and the combination of the first reference mark image I2 and the first sample mark image I3 is determined. In fact, the distance S is determined between the midpoints of the second reference mark image I1 and the midpoint of the combined image of the first reference mark image I2 and the first sample mark image I3.

Distance S may be determined by using a SEM, however, since both the second reference mark image I1 and the combined first reference mark and first sample mark image I2, I3 are relatively large (according to the example given above of approximately 7700-8000 nm), the distance S may also be determined by using an alignment sensor that is commonly used in a lithographic projection apparatus. For example, such an alignment sensor may measure a position of an alignment mark. During alignment, the alignment mark is illuminated with an alignment beam of radiation. The alignment beam of radiation is diffracted by the alignment mark into several diffraction orders such as +1, −1, +2 and −2. Using one or more optical elements, each set of corresponding diffraction orders (say+1 and −1) is used to form an image of the alignment mark onto a reference plate. The reference plate comprises a reference grating for each set of corresponding diffraction orders to be measured. Behind each reference grating, a separate detector is arranged to measure the intensity of the radiation in the image passing through the reference grating. By moving the alignment mark relative to the reference plate, the position with the highest intensity for one or more images is found, which gives the aligned position. To enhance performance, the intensity of several images can be measured and the alignment beam of radiation may comprise multiple colors. Thus, alignment sensor may be used to determine the position and relative position of (part of a) projected mark.

Since the width of the first sample mark image I3 is focus sensitive, the total size of the combined image of the first reference mark image I2 and the first sample mark image I3 depends on the exact amount of defocus D. For instance, looking at FIG. 4b, when the substrate W is moved to a position being more out of focus (higher value for the defocus D), the line width of the first sample mark image I3 will increase, moving the midpoint of the combined image I2, I3 to the right. Thus, the position of the midpoint of the combined image I2, I3 varies as a function of defocus D. Also, the distance S between the second reference mark image I1 and the combined image I2, I3 will vary as a function of defocus D and may therefore be used as an indication of the defocus D.

Figure 5:
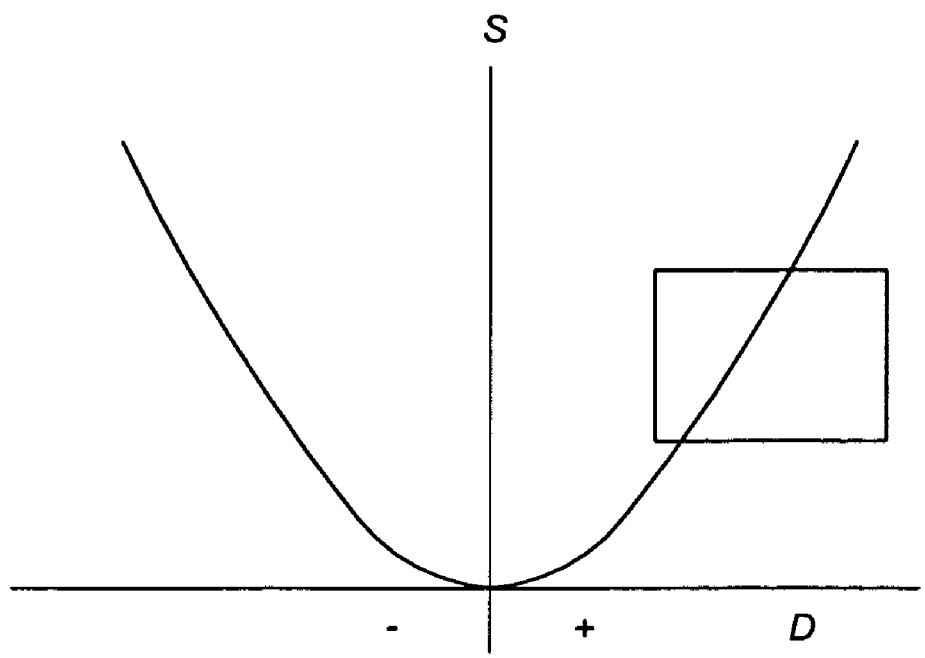
FIG. 5 schematically depict a calibration graph according to an embodiment.

In order to allow deriving the defocus D from the distance S, a calibration relation between the distance S and the defocus D may be determined. This calibration relation may be determined based on computations or based on calibration experiments. FIG. 5 schematically depicts a calibration graph, showing the relation between distance S and defocus D.

Such a calibration relation may be obtained by imaging the marks M1, M2, M3 on a substrate W a number of times, each time the substrate W being in a known position with respect to the focal plane.

As indicated in FIG. 5, the calibration graph ranging from − to + defocus D is "U"-shaped, like a Bossung curve described above. Since such a curve is not sign-sensitive, it is desirable to use only a section of the defocus range, for instance the positive defocus range, as indicated with the square shown in FIG. 5.

In sum, the marks M1, M2, M3 may be imaged. The projection of the first and second reference marks M1, M2 is characterized by a relatively flat Bossung curve (focus insensitive) and the projection of the first sample mark M3 is characterized by a relatively steep Bossung curve (focus sensitive). The projections result in images I1, I2, I3, where image I3 partially overlaps image I2. The amount of overlap may, for instance, be 50% in focus. The line width of image I3 (being focus sensitive) varies as a function of defocus D. This variation influences the line width of the combined image I2, I3. Next, a distance S between the midpoints of image I1 and the combined image I2, I3 is determined, being a measure of the defocus D. A calibration relation may be used to derive the defocus D from the distance S.

The embodiment described above may suffer from an overlay error between the projection of the first and second reference marks M1, M2 and the first sample mark M3. Overlay errors are caused by a lateral shift (i.e. in the plane of the substrate W) of an exposure with respect to a previous exposure.

As a result of a possible overlay error, the position of the projected first sample mark M3 with respect to the first reference mark M2 may not be accurate. For instance, the first sample mark image I3, which may be intended to overlap the first reference mark image I2 by 50% may overlap by only 40%. This results in a different position of the midpoint of the combined first reference mark and the first sample mark images I2, I3, resulting in an error in the determined distance S and, consequently, in the determined defocus D.

For example, FIG. 6 shows a first situation A (the top of FIG. 6) in which images I1, I2, I3 are projected as described above. The distance $S_A$ is determined between the midpoints of the second reference mark image I1 and the combination of the first reference mark and first sample mark images I2, I3. FIG. 6 also shows a second situation B (the bottom of FIG. 6) in which the position of the first sample mark image I3 is moved to the right with respect to the first reference mark image I2 as a result of an overlay error O. Situation A and B are both in a similar (de-)focus position, so the width of the first sample mark image I3 in situation B is not changed with respect to situation A. As a result, the position of the midpoint of the combined image I2, I3 has also moved to the right (by half the distance of the overlay error O), resulting in a higher value of a distance $S_B$ with respect to $S_A$. Thus, the defocus value $D_A$ associated with distance $S_A$ differs from the defocus value $D_B$ associated with distance $S_B$. Based on this example, it will be understood that an overlay error O may result in an error in the determined defocus D.

Therefore, an embodiment is proposed that doesn't suffer from overlay error. According to this embodiment, a second sample mark M4 is projected. This second sample mark M4 is also a focus sensitive mark, which may be similar to the first sample mark M3.

FIG. 7a schematically depicts first and second reference marks M1, M2 and first and second sample marks M3, M4 according to this embodiment. The first and second reference marks M1, M2 and first and second sample mark M3, M4 may be provided by a patterning device MA. The marks M1, M2, M3, M4 may simply be lines having a predetermined width.

Similar to the previous embodiment, the first and second reference marks M1, M2 may be chosen to have a width approximately 15 times larger than the width of the first sample mark M3 and the second sample mark M4. The projected images I1, I2 corresponding to the first and second reference marks M1, M2 may, for instance, be bars with a width of 7700 nm, while the projected images I3, I4 corresponding to the first and second sample marks M3, M4 may be bars with a width of 500 nm.

FIG. 7a shows a cross-sectional view of these lines, showing their relative width. It will be understood that the lines extend in a direction perpendicular to the drawing surface.

The first and second reference marks M1, M2 and first and second sample marks M3, M4 may be projected on a substrate W, as described above, resulting in respective first and second reference mark images I1, I2 and first and second sample mark images I3, I4. First, the first and second reference marks M1, M2 are projected. Next, the first and second sample marks M3, M4 are projected such that the first sample mark image I3 at least partially overlaps the first reference mark image I2 and the second sample mark image I4 at least partially overlaps the second reference mark image I1. In both cases the overlap may be, for instance, 50%. The resulting images are schematically shown in FIG. 7b, showing a situation C.

FIG. 7b shows that the first and second sample mark images I3, I4 are positioned on opposite sides of the first and second reference mark images I2, I1, i.e. the first sample mark image I3 is positioned at the right side of the first reference mark image I2, while the second sample mark image I4 is positioned on the left side of the second reference mark image I1. This may be the other way around, i.e. the first sample mark image I3 is at the left side of the first reference mark image I2, and the second sample mark image I4 is at the right side of the second reference mark image I1. Further, for situation C, FIG. 7b shows the distance $S_C$ between the midpoints of the combined image of the second reference mark image with the second sample mark image I1, I4 and the combined image of the first reference mark image with the first sample mark image I2, I3.

FIG. 7b further shows a situation D, which is similar to situation C except for the fact that an overlay error O has occurred between the imaging of the first and second reference marks M1, M2 and the first and second sample marks M3, M4. It can be seen that the first and second sample mark images I3, I4 are shifted to the left with respect to the first and second sample mark images I3, I4 depicted in situation C. As a result, the midpoints of the combined image of the second reference mark image and the second sample mark image I1, I4 and the combined image of the first reference mark image and the first sample mark image I2, I3 are also shifted to the left (by half of the overlay error O). However, the distance $S_D$ between the midpoints of the combined image I1, I4 and the combined image I2, I3 for situation D is equal to $S_C$ for situation C. Therefore, the determined defocus value $D_C$ for situation C and the defocus value $D_D$ for situation D are substantially equal.

Thus, this embodiment does not suffer from overlay error, i.e. an overlay error does not influence the resulting distance S and thus does not influence the resulting determined defocus D. By adding a second sample mark M4, resulting in a second sample mark image I4 positioned on the opposite side of the second reference mark image I1 compared to the position of the first sample mark image I3 with respect to the first reference mark image I2, a focus test is provided that does not suffer from possible overlay error.

The above embodiments describe a focus test providing focus information for marks having lines extending in a single orientation, for instance the X-direction. However, an optimal focal position of a substrate W with respect to the projection system PS may differ for lines having different orientations. For instance, an optimal focal position $F_x$ for lines extending in a first direction (i.e. the X-direction) may differ from the optimal focal position $F_y$ for lines extending in a second direction (i.e. the Y-direction, a direction substantially perpendicular to the first direction). Both the first and second directions may be substantially perpendicular with respect to the optical axis of the projection system PS.

Figure 8A:
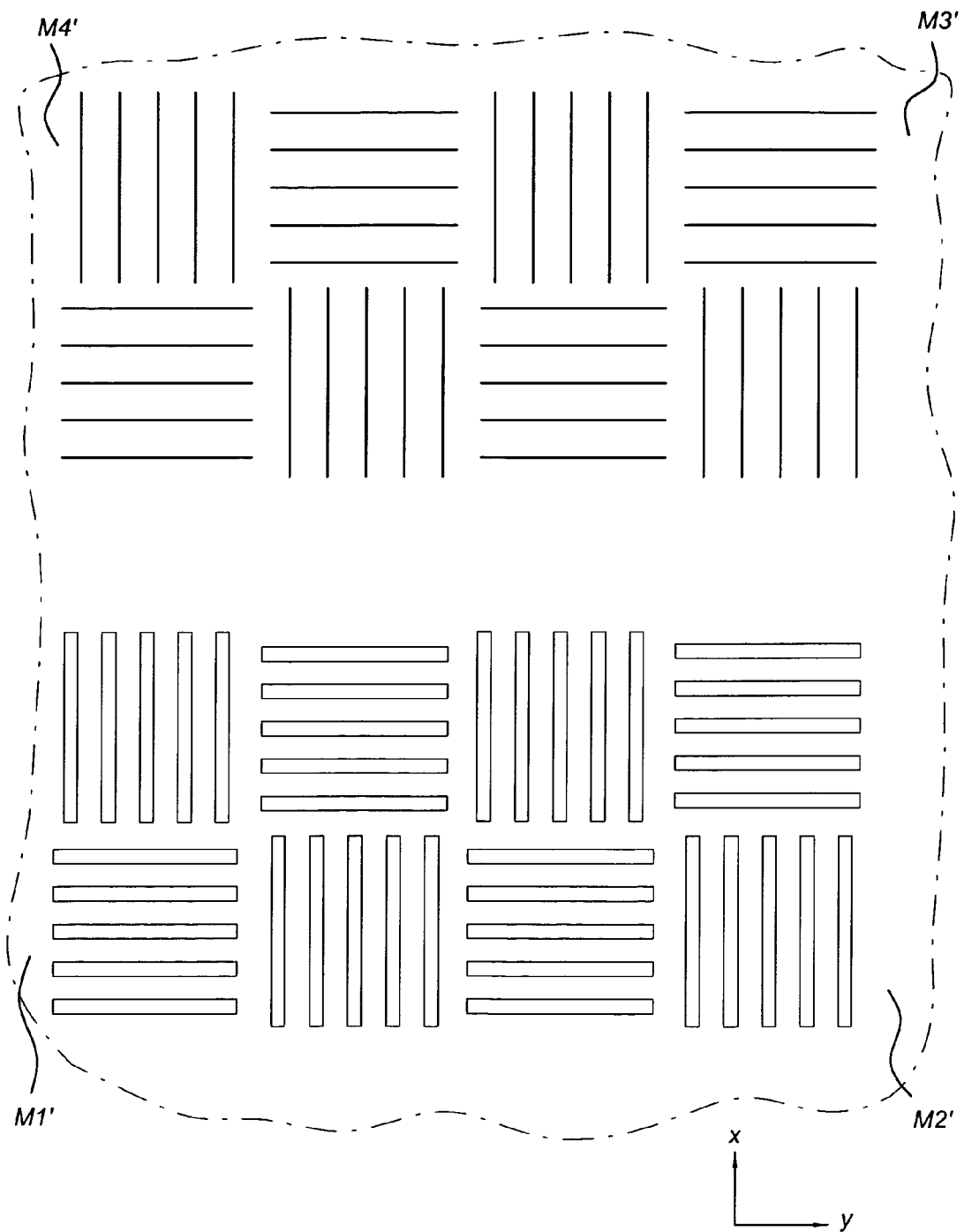

Therefore, according to this embodiment, marks are provided comprising lines in the first and second directions. FIG. 8a schematically depicts a first and second reference mark M1', M2' and first and second sample mark M3', M4' that may be provided by a patterning device MA. The marks comprise lines in the first and second directions. FIG. 8a shows the marks as may be provided by a patterning device MA.

FIG. 8a shows first and second reference marks M1', M2' and first and second sample marks M3', M4', each mark comprising a number of lines extending in the first direction, i.e. the X direction, and a number of lines extending in the second direction, i.e. the Y direction. The lines of the second reference mark M1' and the first reference mark M2' may be relatively wide, to allow focus insensitive projection. The lines may, for instance, each have a width of about 7700 nm. The lines of the first sample mark M3' and the second sample mark M4' may be relatively thin, to allow focus sensitive projection. The lines may, for instance, each have a width of about 500 nm.

In a first projection action, the first and second reference marks M1', M2' are projected on a substrate W using projection system PS to create first and second reference mark images I1', I2'. The projection is done in such a way that it is relatively focus insensitive, as explained above.

In a next projection action, the first and second sample marks M3', M4' are projected such that each corresponding sample mark image I3', I4' of the first and second sample marks M3', M4' partially overlaps corresponding lines of the first and second reference mark images I1', I2'.

The lines of the first sample mark M3' extending in the first direction are projected in such away that the lines of the first sample mark image I3' at least partially overlap the lines of the first reference mark image I2' extending in the first direction. The overlap area may be on a first side of the lines of the first reference mark image I2'.

The lines of the second sample mark M4' extending in the first direction are projected in such a way that the lines of the second sample mark image I4' at least partially overlap the lines of the second reference mark image I1' extending in the first direction. The overlap area may be on a second side of the lines of the second reference mark image I1', where the second side is opposite the first side.

The lines of the first sample mark M3' extending in the second direction are projected in such a way that the lines of the first sample mark image I3' at least partially overlap the lines of the first reference mark image I2' extending in the second direction. The overlap area may be on a first side of the lines of the first reference mark image I2'.

The lines of the second sample mark M4' extending in the second direction are projected in such a way that the lines of the second sample mark image I4' at least partially overlap the lines of the second reference mark image I1' extending in the second direction. The overlap area may be on a second side of the lines of the second reference mark image I1', where the second side is opposite the first side for the lines of the first reference mark image I2'.

Figure 8B:
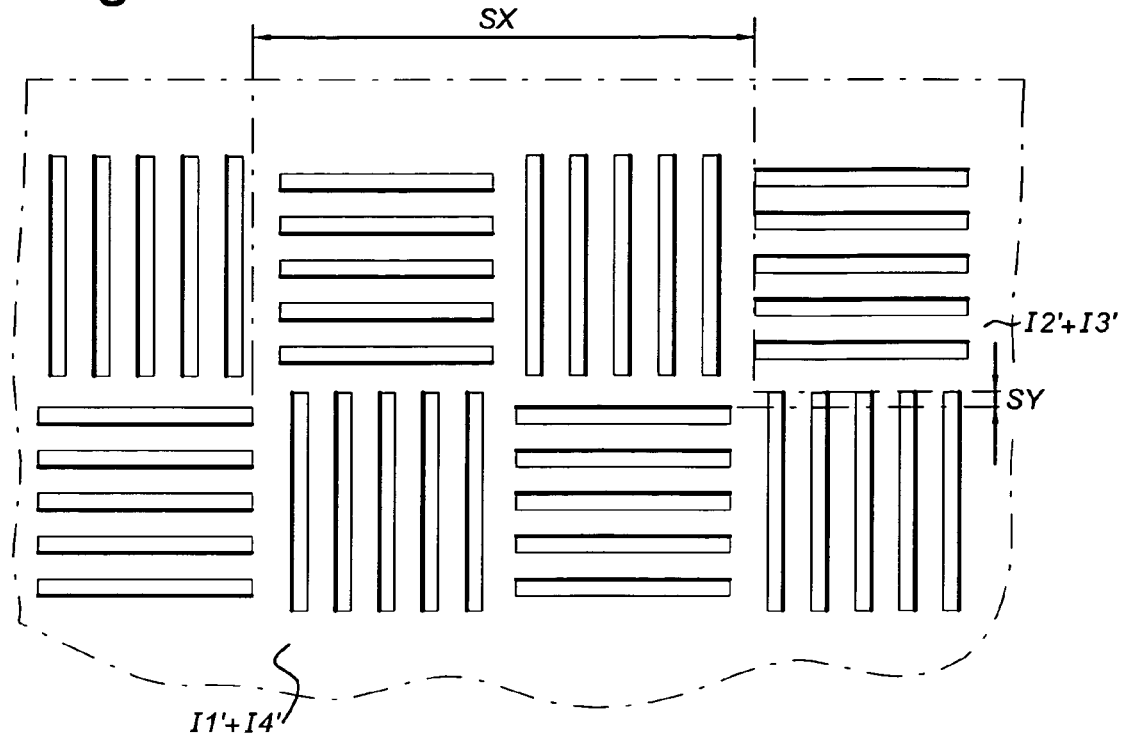

This results in a combined image as shown in FIG. 8b, comprising a combined image of the second reference mark image I1' and the second sample mark image I4', indicated with the reference I1'+I4', and a combined image of the first reference mark image I2' and the first sample mark image I3', indicated with the reference I2'+I3'.

In a next action, the still latent images are made visible by performing post-exposure processing, for instance, a post exposure bake. After this, the distances $S_X$, $S_Y$ of the combined image I1'+I4' with respect to the combined image I2'+I3' are determined. The distance $S_X$ is in the first direction and the distance $S_Y$ is in the second direction as indicated in FIG. 8b.

Determining distances $S_X$, $S_Y$ may be done by first determining the distance between each image line in the first direction of the combined image I1'+I4' with respect to each corresponding line in the first direction of the combined image I2'+I3' and computing an average distance $S_X$. Secondly, the distance between each image line in the second direction of the combined image I1'+I4' with respect to each corresponding line in the second direction of the combined image I2'+I3' is determined and an average distance SY is computed.

Distances may be determined by using a SEM, however, since the combined images are relatively large (according to the example given above approximately 7700-8000 nm), the distances may also be determined by using an alignment sensor that is commonly used in lithographic projection apparatus. An example of such an alignment sensor is described above.

Based on the determined distances $S_X$, $S_Y$, the corresponding amount of defocus $D_X$ and $D_Y$ may be computed, using a predetermined calibration relation, as described above.

Based on the determined defocus values, optimal positioning of the substrate W with respect to the projection system PS may be determined. This may be done by averaging the defocus values $D_X$, $D_Y$. Also, a weighted average may be computed, for instance when the pattern to be projected mainly comprises pattern lines extending in one direction. For instance, when the pattern to be projected comprises a relatively fine pattern in the first direction and only a relatively coarse pattern in the second direction, the defocus value $D_X$ may be weighted more heavily than defocus value $D_Y$.

It will be understood that this embodiment doesn't suffer from overlay error, as the first and second sample mark images I3', I4' are projected on opposite sides of the first and second reference mark images I1', I2'. Of course, this embodiment described here may also be used as a variant to the first embodiment described above, omitting the second sample mark M4'.

One or more of the embodiments described above may be used in a lithographic projection apparatus. The focus test as described above may be employed in a reflective lithographic apparatus as well as in a transmissive lithographic projection apparatus.

According to one or more embodiments described above, thin focus sensitive lines are projected such that their images partially overlap relatively thicker focus insensitive lines. As a result, focus sensitive images are created that are relatively thick. This makes it possible to measure these images using a state of the art alignment sensor, such as described above, and not necessarily with a SEM. Using an alignment sensor may result in a higher throughput, as alignment measurement may be performed faster using an alignment sensor (e.g. 12,000 marks per hour) than using a SEM (e.g. 900 marks per hour).

One or more of the embodiments described above provide mark based solutions, and are therefore easy to implement. No special hardware tools or devices are needed and no hardware changes are necessary to the lithographic apparatus used.

As explained above, the exposure dose also influences the resulting image (i.e. influences the Bossung curve). Fluctuation of the radiation beam therefore influences the outcome of the focus test described above. Newly developed EUV radiation sources may experience unwanted fluctuation of the dose. However, this source of error may be corrected. The dose fluctuation may be determined and registered, simply by measuring the dose as outputted by the radiation source. Based on the determined fluctuation and theoretical or experimental knowledge of the influence of dose variation on the resulting images, errors caused by dose fluctuation may be corrected.

Of course, one or more embodiments are conceivable in which all marks have similar dimensions, and only dose variations are used to generate a focus sensitive and a focus insensitive exposure.

Figure 9:
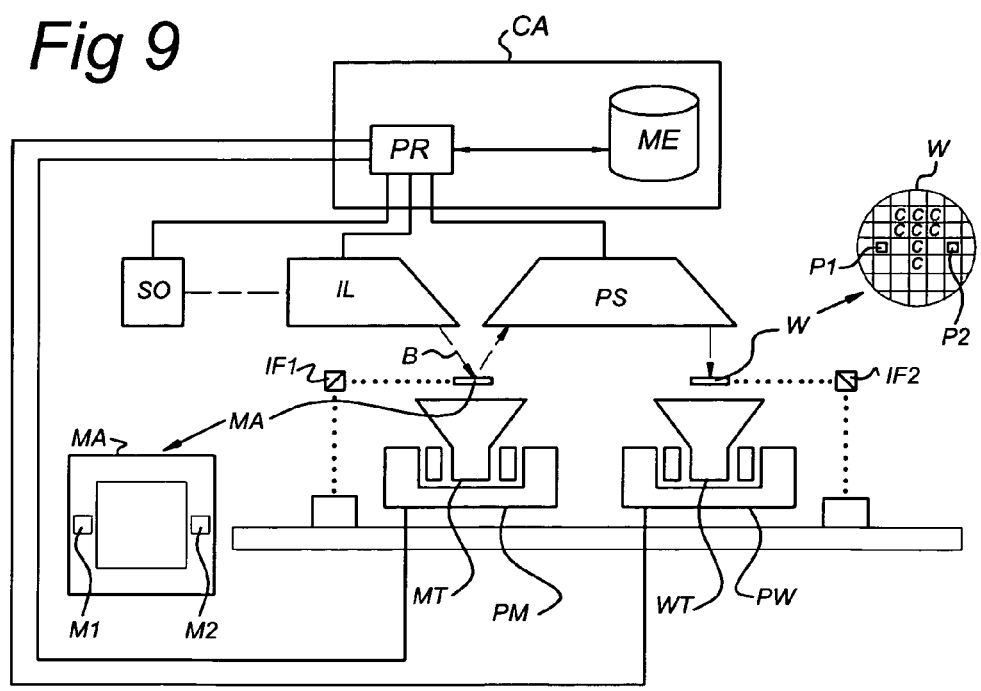
FIG. 9 schematically depicts a lithographic apparatus according to an embodiment.

It will be understood that the methods described above may all be carried out by a computer arrangement CA comprising a processor PR configured to perform arithmetical operations, and a memory ME. This is schematically depicted in FIG. 9, showing an example of a lithographic apparatus comprising the processor PR arranged to communicate with memory ME. Memory ME may be any type of memory arranged to store instructions and data, such as a tape unit, hard disk, a Read Only Memory (ROM), Electrically Erasable Programmable Read Only Memory (EEPROM) and a Random Access Memory (RAM).

The processor PR may be arranged to read and execute program code stored in memory ME configured to provide the processor PR with the functionality to perform one or more of the methods described above. In order to be able to perform the one or more methods, the processor PR may be arranged to control the position of the support structure MT, the position of the substrate table WT, the source SO, the illuminator IL, the projection system PS and/or other components of the lithographic apparatus. The processor PR may be specially provided to perform one or more of the described embodiments, but may also be a central processor arranged to control the lithographic apparatus as a whole and provided with additional functionality to perform one or more of the described embodiments.

It should be understood that there may be provided more and/or other units, such as memory units, input devices and read devices known to persons skilled in the art. Moreover, one or more of them may be physically located remote from the processor PR, if required. The processor PR is shown as one box, however, it may comprise several processing units functioning in parallel or controlled by one main processor PR that may be located remote from one another, as is known to persons skilled in the art.

Although all connections in FIG. 9 are shown as physical connections, one or more of these connections can be made wireless. They are only intended to show that "connected" units are arranged to communicate with one another in someway. The system can be any signal processing system with analog and/or digital and/or software technology arranged to perform the functions discussed here.

While in some instances herein positioning the substrate in the focal plane of the projection system is referred to, this should be understood as positioning the layer of resist provided on the substrate in the focal plane of the projection system. Further, where expressions like first projection, second projection, first image, second image, etc. are used, the words 'first', 'second', etc. are not to be understood as referring to the order in which they take place. It is to be understood that the second projection may take place before or after the first projection.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A method for a focus test, comprising:
performing a first projection by using a radiation beam to project a first reference mark onto a substrate to generate a first reference mark image; and
performing a second projection by using a radiation beam to project a first sample mark onto the substrate to generate a first sample mark image,
wherein the first reference mark image and the first sample mark image at least partially overlap and the second projection is relatively focus sensitive compared to the first projection.

2. The method of claim 1, wherein the first reference mark and the first sample mark are provided by a patterning device.

3. The method of claim 1, further comprising projecting a second reference mark in the first projection to generate a second reference mark image.

4. The method of claim 3, further comprising determining a distance between the second reference mark image and the combined first reference mark and first sample mark image.

5. The method of claim 4, wherein the distance is determined using an alignment sensor or a scanning electron microscope.

6. The method of claim 4, further comprising determining, based on the determined distance, a defocus of the substrate with respect to the focus of a projection system used for the first and second projections.

7. The method of claim 3, further comprising projecting a second sample mark in the second projection to generate a second sample mark image, the second sample mark image at least partially overlaps the second reference mark image and the first and second sample mark images are positioned on opposite sides of the first and second reference mark images.

8. The method of claim 1, wherein the first reference mark and the first sample mark each comprise a first line extending in a first direction and a second line extending in a second direction, and further comprising performing the second projection in such a way that the imaged first line of the first sample mark at least partially overlaps the imaged first line of the first reference mark and that the imaged second line of the first sample mark at least partially overlaps the imaged second line of the first reference mark.

9. The method of claim 8, wherein the first direction is substantially perpendicular to the second direction.

10. The method of claim 8, further comprising:
projecting a second reference mark in the first projection to generate a second reference mark image, the second reference mark and a second sample mark each comprising a first line extending in a first direction and a second line extending in a second direction; and
projecting the second sample mark in the second projection to generate a second sample mark image in such a way that the imaged first line of the second sample mark at least partially overlaps the imaged first line of the second reference mark and the imaged second line of the second sample mark at least partially overlaps the imaged second line of the second reference mark,
wherein the first and second sample mark images are positioned on opposite sides of the first and second reference mark images.

11. The method of claim 1, wherein the first reference mark has a pattern that is large compared to a pattern of the first sample mark to enable the second projection to be relatively focus sensitive compared to the first projection.

12. The method of claim 11, wherein the pattern of the first reference mark is approximately 15 times larger than the pattern of the first sample mark.

13. The method of claim 1, wherein the first projection is performed with a radiation beam having a lower exposure dose than that of a radiation beam used for the second projection.

14. The method of claim 1, further comprising performing post-exposure processing to make the first reference mark and first sample mark images visible.

15. A device manufacturing method, comprising:
determining a defocus, comprising:
performing a first projection by using a radiation beam to project a first reference mark onto a substrate to generate a first reference mark image, and
performing a second projection by using a radiation beam to project a first sample mark onto the substrate to generate a first sample mark image,
wherein the first reference mark image and the first sample mark image at least partially overlap, the first reference mark and the first sample mark each comprise a first line extending in a first direction and a second line extending in a second direction, the second projection is relatively focus sensitive compared to the first projection, and the second projection is performed in such a way that the imaged first line of the first sample mark at least partially overlaps the imaged first line of the first reference mark and that the imaged second line of the first sample mark at least partially overlaps the imaged second line of the first reference mark;
adjusting the relative position of a substrate based on the determined defocus; and
projecting a patterned beam of radiation onto the substrate.

16. A lithographic apparatus comprising:
a support constructed to support a patterning device, the patterning device being capable of imparting a radiation beam with a pattern in its cross-section to form a patterned radiation beam;
a substrate table constructed to hold a substrate;
a projection system configured to project the patterned radiation beam onto a target portion of the substrate; and
a computer arrangement to perform a method for a focus test by the lithographic apparatus, the method comprising:
performing a first projection by using a radiation beam to project a first reference mark onto a substrate to generate a first reference mark image, and
performing a second projection by using a radiation beam to project a first sample mark onto the substrate to generate a first sample mark image,
wherein the first reference mark image and the first sample mark image at least partially overlap and the second projection is relatively focus sensitive compared to the first projection.

17. The lithographic apparatus of claim 16, wherein the computer arrangement comprises a processor configured to perform arithmetical operations, and a memory, the processor arranged to read and execute programming code stored in the memory to perform the method.

18. A computer readable storage medium having a computer program stored therein, the computer program comprising instructions and data to allow a processor to perform a method for a focus test, the method comprising:
performing a first projection by using a radiation beam to project a first reference mark onto a substrate to generate a first reference mark image; and
performing a second projection by using a radiation beam to project a first sample mark onto the substrate to generate a first sample mark image,
wherein the first reference mark image and the first sample mark image at least partially overlap and the second projection is relatively focus sensitive compared to the first projection.

19. The computer readable storage medium of claim 18, wherein the method further comprises projecting a second reference mark in the first projection to generate a second reference mark image.

20. The computer readable storage medium of claim 18, wherein the method further comprises projecting a second sample mark in the second projection to generate a second sample mark image, the second sample mark image at least partially overlaps the second reference mark image and the first and second sample mark images are positioned on opposite sides of the first and second reference mark images.

21. The computer readable storage medium of claim 18, wherein the first reference mark and the first sample mark each comprise a first line extending in a first direction and a second line extending in a second direction, and the method further comprises performing the second projection in such a way that the imaged first line of the first sample mark at least partially overlaps the imaged first line of the first reference mark and that the imaged second line of the first sample mark at least partially overlaps the imaged second line of the first reference mark.

22. The computer readable storage medium of claim 21, wherein the method further comprises:
projecting a second reference mark in the first projection to generate a second reference mark image, the second reference mark and a second sample mark each comprising a first line extending in a first direction and a second line extending in a second direction; and
projecting the second sample mark in the second projection to generate a second sample mark image in such a way that the imaged first line of the second sample mark at least partially overlaps the imaged first line of the second reference mark and the imaged second line of the second sample mark at least partially overlaps the imaged second line of the second reference mark,
wherein the first and second sample mark images are positioned on opposite sides of the first and second reference mark images.

* * * * *